United States Patent
Werner

(10) Patent No.: US 9,343,588 B2
(45) Date of Patent: May 17, 2016

(54) NORMALLY-OFF SEMICONDUCTOR SWITCHES AND NORMALLY-OFF JFETS

(75) Inventor: Wolfgang Werner, Munich (DE)

(73) Assignee: Infineon Technologies Austria AG, Villach (AT)

(*) Notice: Subject to any disclaimer, the term of this patent is extended or adjusted under 35 U.S.C. 154(b) by 900 days.

(21) Appl. No.: 13/031,956

(22) Filed: Feb. 22, 2011

(65) Prior Publication Data

US 2012/0211806 A1    Aug. 23, 2012

(51) Int. Cl.
| | |
|---|---|
| *H01L 29/808* | (2006.01) |
| *H01L 29/10* | (2006.01) |
| *H01L 29/417* | (2006.01) |
| *H01L 29/423* | (2006.01) |

(52) U.S. Cl.
CPC .......... *H01L 29/808* (2013.01); *H01L 29/1066* (2013.01); *H01L 29/41758* (2013.01); *H01L 29/42316* (2013.01); *H01L 29/8083* (2013.01)

(58) Field of Classification Search
USPC ........... 257/256, 263, 285, E29.312, E29.313
See application file for complete search history.

(56) References Cited

U.S. PATENT DOCUMENTS

| | | | |
|---|---|---|---|
| 4,126,900 A | 11/1978 | Koomen et al. | |
| 4,435,785 A * | 3/1984 | Chapman | 365/149 |
| 5,159,414 A * | 10/1992 | Izumi et al. | 257/192 |
| 6,281,521 B1 * | 8/2001 | Singh | 257/77 |
| 2002/0003250 A1 * | 1/2002 | Werner | 257/302 |
| 2002/0167011 A1 | 11/2002 | Kumar et al. | |
| 2003/0168704 A1 * | 9/2003 | Harada et al. | 257/368 |
| 2006/0118813 A1 | 6/2006 | Harada et al. | |
| 2009/0134434 A1 | 5/2009 | Werner | |

FOREIGN PATENT DOCUMENTS

| | | |
|---|---|---|
| CN | 1308774 A | 8/2001 |
| CN | 1496587 A | 5/2004 |
| DE | 10005772 A1 | 8/2001 |

OTHER PUBLICATIONS

Xie, Weize et al., Purdue WBG, Nonvolatile Memories, "Silicone Carbide Nonvolatile Memory Devices", May 7, 2008.
Arai, Michio. "Charge-Storage Junction Field Effect Transistor." IEEE Transactions on Electron Devices, vol. 22, No. 4. IEEE, Apr. 1975. pp. 181-185.
State Intellectual Property Office, P.R. China, First Office Action, Application No. 201210040508, Jan. 17, 2014 (in Chinese).
State Intellectual Property Office, P.R. China, First Office Action, Application No. 201210040508, Jan. 17, 2014 (Translation to English—translator unknown).

* cited by examiner

*Primary Examiner* — Lynne Gurley
*Assistant Examiner* — Vernon P Webb
(74) *Attorney, Agent, or Firm* — Murphy, Bilak & Homiller, PLLC

(57) ABSTRACT

A normally-off JFET is provided. The normally-off JFET includes a channel region of a first conductivity type, a floating semiconductor region of a second conductivity type adjoining the channel region, and a contact region of the first conductivity type adjoining the floating semiconductor region. The floating semiconductor region is arranged between the contact region and the channel region. Further, a normally-off semiconductor switch is provided.

25 Claims, 7 Drawing Sheets

100

NORMALLY-OFF SEMICONDUCTOR SWITCHES AND NORMALLY-OFF JFETS

TECHNICAL FIELD

This specification generally relates to normally-off semiconductor switches, in particular to wide band-gap field-effect semiconductor switches, and more particularly to normally-off JFETs (junction field-effect transistors).

BACKGROUND

Many functions of modern devices in automotive, consumer and industrial applications, such as computer technology, mobile communications technology, converting electrical energy and driving an electric motor or an electric machine, rely on field effect semiconductor devices.

The energy efficiency of, for example, power converters and motor drivers depends on the performance, in particular on the on-resistance (Ron), of the typically used power semiconductor devices. Furthermore, normally-off operating semiconductor devices are often desirable for safety reasons. Normally-off operating may also reduce the overall power consumption of the semiconductor devices since no static driving power is required.

For silicon DMOS (double-diffused metal-oxide-semiconductor) transistors with operating voltages above about 200 V, the on-resistance is mainly determined by the resistance of the drift region. The doping concentration of the drift region of these transistors is, however, limited to ensure a high enough blocking capability.

Wide band-gap semiconductor materials such as SiC have a higher break-down field than low band-gap semiconductor materials. Accordingly, the resistance of the drift region of wide band-gap semiconductor devices may be reduced. However, the so far realized SiC (silicon carbide) normally-off operating power MOSFETs (metal oxide semiconductor field-effect transistors) typically have a relatively high on-resistance due to the low charge carrier mobility close to the interface between SiC and the widely used gate oxide $SiO_2$ (silicon dioxide). Furthermore, the long term stability and defect density of $SiO_2$ are often unsatisfactory when used as a gate oxide on SiC.

SUMMARY

According to an embodiment, a normally-off JFET is provided. The normally-off JFET includes a channel region of a first conductivity type, a floating semiconductor region of a second conductivity type adjoining the channel region, and a contact region of the first conductivity type adjoining the floating semiconductor region. The floating semiconductor region is arranged between the contact region and the channel region.

According to an embodiment, a normally-off semiconductor switch having a semiconductor body is provided. The semiconductor body includes a channel region of a first conductivity type, a floating semiconductor region of a second conductivity type forming a first pn-junction with the channel region, and a contact region of the first conductivity type forming a second pn-junction with the floating semiconductor region. The floating semiconductor region is arranged between the contact region and the channel region. The normally-off semiconductor switch further includes a gate metallization in ohmic contact with the contact region.

According to an embodiment, a normally-off JFET is provided. The normally-off JFET includes a channel region of a first conductivity type and a gate region of a second conductivity type adjoining the channel region. The normally-off JFET further includes a gate metallization and a capacitor formed between the gate metallization and the gate region. The gate region can be a floating gate region.

According to an embodiment, a normally-off semiconductor switch having a semiconductor body is provided. The semiconductor body includes a channel region of a first conductivity type, and a gate region of a second conductivity type, which can be a floating gate region. The gate region forms a first pn-junction with the channel region. The first pn-junction has a first depletion capacitance. The normally-off semiconductor switch further includes a gate metallization and a capacitor formed between the gate metallization and the gate region. The capacitor has a capacitance higher than the first depletion capacitance.

According to an embodiment, a normally-off JFET is provided. The normally-off JFET includes a channel region of a first conductivity type and a gate region of a second conductivity type forming a first pn-junction with the channel region. The gate region can be a floating gate region. The first pn-junction has a first depletion capacitance. The normally-off JFET further includes a source electrode in ohmic contact with the channel region, a drain electrode in ohmic contact with the channel region, a gate metallization, and a capacitive element. The capacitive element connects the gate metallization with the gate region and has a capacitance larger than the first depletion capacitance.

According to an embodiment, a normally-off wide band-gap JFET is provided. The normally-off wide band-gap JFET includes a channel region of a first conductivity type, and a charge storing gate region of a second conductivity type which forms a first pn-junction with the channel region. The normally-off JFET is configured to store an excess of minority charge carriers of the gate region in the gate region so that the channel region is depleted in an off-state of the normally-off JFET.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
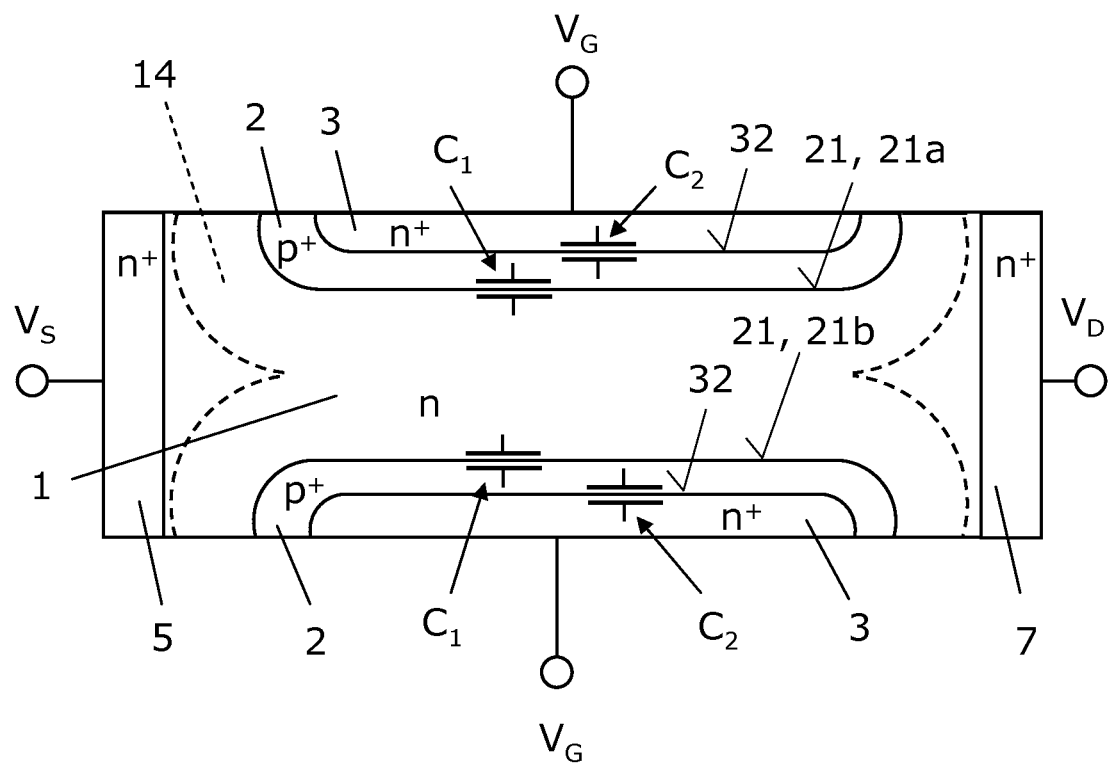
FIG. 1 schematically illustrates a normally-off JFET according to one or more embodiments.

Reference is now made in detail to various embodiments, one or more examples of which are illustrated in the figures.

Each example is provided by way of explanation, and is not meant as a limitation of the invention. For example, features illustrated or described as part of one embodiment can be used on or in conjunction with other embodiments to yield yet a further embodiment. It is intended that the present invention include such modifications and variations. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, semiconductor devices, in particular to unipolar field effect semiconductor devices such as JFETs (junction field effect transistors). The semiconductor devices are typically vertical power semiconductor devices.

The term "power semiconductor device" as used in this specification intends to describe a semiconductor device on a single chip with high voltage and/or high current switching capabilities. In other words, power semiconductor devices are intended for high current, typically in the Ampere range, and/or voltages above 200 V, more typically above 400 V and up to about 10,000 V.

In the context of the present specification, the term "in ohmic contact" intends to describe that there is an ohmic electric connection or ohmic current path between two regions, portion or parts of a semiconductor device through the semiconductor device or between different electrodes of one or more devices or between a electrode or a metallization and a portion or a part of the semiconductor device.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of a metal such as Al, Ti, W and Co but may also be made of a material with metallic or near metallic properties with respect to electric conductivity such as highly doped n-type or p-type poly-Si, TiN or an electrically conductive silicide such as WSi$_2$. The metallization may also include different electrically conductive materials, for example a stack of those materials.

In the following, embodiments pertaining to semiconductor devices are explained mainly with reference to silicon carbide (SiC) semiconductor devices. Accordingly, a monocrystalline semiconductor region or layer is typically a monocrystalline SiC-region or SiC-layer. It should, however, be understood that the semiconductor body can be made of any semiconductor material, in particular any wide band-gap semiconductor material, suitable for manufacturing a semiconductor device. Examples include elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name a few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN), aluminum gallium indium nitride (AlGaInN), indium gallium nitride (InGaN), aluminum gallium indium nitride (AlGaInN), indium gallium nitride (InGaN)-gallium nitride (GaN), aluminum gallium nitride (AlGaN)-gallium nitride (GaN), indium gallium nitride (InGaN), aluminum gallium nitride (AlGaN), silicon-silicon carbide (Si$_x$C$_{1-x}$) and silicon-SiGe heterojunction semiconductor materials. For power semiconductor applications mainly Si, SiC, GaAs and GaN materials are used. If the semiconductor body comprises a wide band-gap material such as SiC or GaN which has a high breakdown voltage and high critical avalanche field strength, respectively, the doping of the respective semiconductor regions can be chosen higher which reduces the on-resistance R$_{on}$. Furthermore, the leakage current across pn-junctions formed in wide band-gap materials is often negligible. The term "wide band-gap semiconductor material" as used in this specification intends to describe a semiconductor material with an electronic band-gap of about at least two electron volts (eV).

FIG. 1 illustrates an embodiment of a JFET 100. JFET 100 includes a channel region 1 of a first conductivity type (n-type) and a contact region 3 of the first conductivity type. The contact region 3 is in ohmic contact with a gate metallization so that a gate voltage V$_G$ may be applied to the contact region 3. A maximum doping concentration of the contact region 3 is typically higher than a maximum doping concentration of the channel region 1.

According to an embodiment, a floating semiconductor region 2 of a second conductivity type (p-type) is arranged between and adjoins the contact region 3 and the channel region 1, respectively. Accordingly, a first pn-junction 21 is formed between the floating semiconductor region 2 and the channel region 1, and a second pn-junction 32 is formed between the contact region 3 and the floating semiconductor region 2. A maximum doping concentration of the floating semiconductor region 2 is typically higher than the maximum doping concentration of the channel region 1. Further, the maximum doping concentration of the floating semiconductor region 2 is typically lower than the maximum doping concentration the contact region 3.

Depending on voltage drop between the channel region 1 and the floating semiconductor region 2, a depletion layer of the first pn-junction 21 extends into the channel region 1. The depletion layer, which may also be referred to as a space charge region, typically also extends into the floating semiconductor region 2, however to a much lesser extent due a higher maximum doping concentration of the floating semiconductor region 2 as compared to the channel region 1. The flow of electric charges (electrons) from a source region 5 of the first conductivity type ($n^+$-type), through the channel region 1 and to a drain region 7 of the first conductivity type ($n^+$-type) of the JFET 100 may be controlled by changing the size and/or geometry of the depletion layer of the first pn-junction 21 by applying appropriate voltages between the contact region 3 and the channel region 1. Accordingly, the floating semiconductor region 2 and the contact region 3 typically form a gate region and a gate control electrode, respectively. Likewise, the source region 5 and the drain region 7 typically form a source electrode and a drain electrode, respectively. When the voltage drop between the channel region 1 and the floating semiconductor region or gate region 2 exceeds a threshold, which mainly depends on geometry and the doping profile of the channel region 1, at least a portion 14 of the channel region 1 is completely depleted so that substantially no current can flow from the source region 5 to the drain region 7. This state of the JFET 100 is referred to as the off-state. The terms "depleted" and "completely depleted" intend to describe that a semiconductor region comprises substantially no free charge carriers.

In the exemplary embodiment illustrated in FIG. 1, the off-state corresponds to a depletion layer which extends from the illustrated upper portion 21a to the lower portion 21b of the first pn-junction 21. When the depletion layers of the illustrated upper portion 21a and lower portion 21b of the first pn-junction 21 do not merge, the JFET 100 is in a conducting or on-state. Accordingly, the JFET 100 may be operated as a field-effect semiconductor switch.

According to an embodiment, the JFET 100 is configured to store excess electrons, i.e. an excess of minority charge carriers of the floating semiconductor region 2, in the floating semiconductor region 2 so that the portion 14 of the channel region 1 is depleted in the off-state of the JFET 100. To ensure that the charge carriers remain trapped, no ohmic current path is typically provided between the floating semiconductor region 2 and other semiconductor regions of the JFET 100. Accordingly, the JFET 100 typically forms a normally-off JFET. When a wide band-gap semiconductor material such as SiC or GaN is used to form the JFET 100, excess charges may be stored in the floating semiconductor region 2 for many years or even for many thousand years at room temperature. This is due to the extremely low leakage current across pn-junctions of wide ban-gap semiconductor materials. Therefore, the floating semiconductor region 2 is also referred to herein as a charge storing gate region.

According to an embodiment, the contact region 3 forms a second pn-junction 32 with the floating semiconductor region 2. A maximum doping concentration of the contact region 3 is typically also higher than the maximum doping concentration of the channel region 1. Arranging the floating semiconductor region 2 between two semiconductor regions (1, 3) of opposite doping type ensures that any excess minority charges (electrons) are trapped in the floating semiconductor region 2 for sufficiently long times—at least when no external voltages are applied to the JFET 100. This is due to the reverse biasing of both pn-junction 21 and 32 under these conditions.

Accordingly, the floating semiconductor region 2 of the JFET 100 may already be charged during manufacturing or testing and thus delivered as a normally-off semiconductor device.

Typically the JFET 100 further includes a gate metallization in ohmic contact with the contact region 3, a source metallization in ohmic contact with the source region 5 typically forming a source electrode, and a drain metallization in ohmic contact with the drain region 7 typically forming a drain electrode to apply a gate voltage $V_G$, a source voltage $V_S$ and a drain voltage $V_D$, respectively, to the JFET 100. These metallizations are not shown in FIG. 1 for ease of illustration only.

Figure 2:
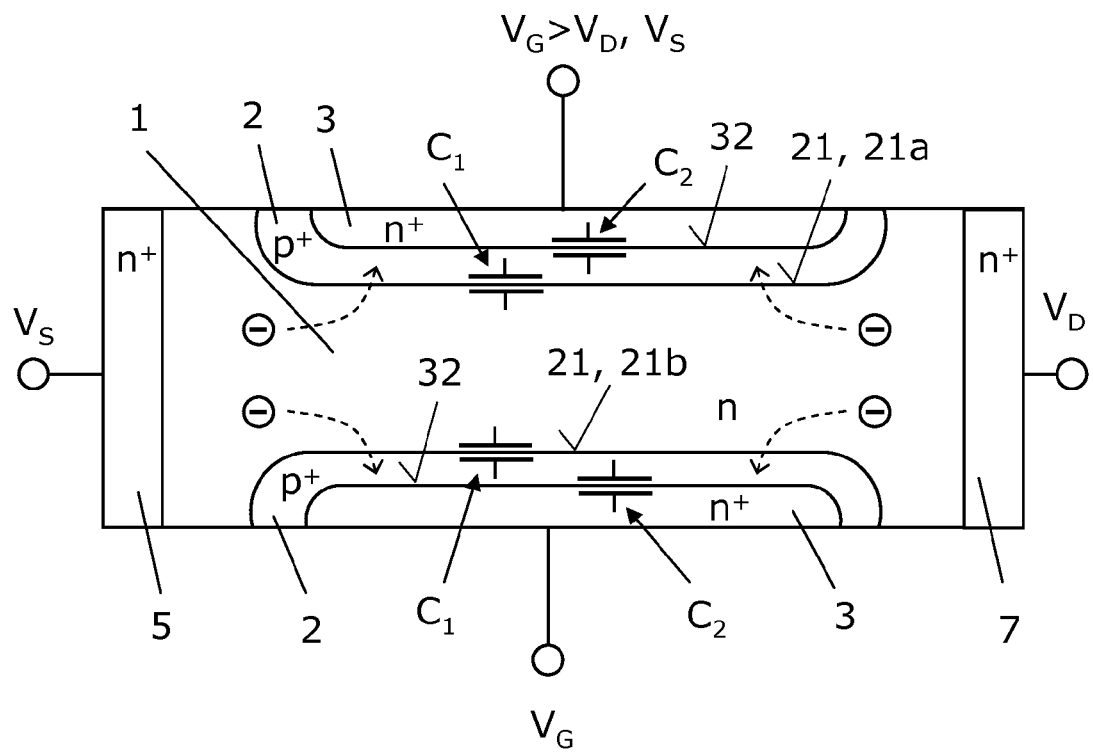
FIG. 2 schematically illustrates an operating mode of the normally-off JFET of FIG. 1 according to one or more embodiments.

FIG. 2 illustrates an embodiment of the JFET 100 in a charging mode. A positive voltage drop between the contact region 3 and the channel region 1 may be used to charge the p-type floating semiconductor region 2 with electrons. For example, a positive gate voltage $V_G$ of about 10 V to about 20 V may be applied to the contact region 3 while the channel region 1 is held at ground by applying ground to the source region 5 and the drain region 7 ($V_S=V_D=0V$), respectively. In this case, the second pn-junction 32 is reverse biased and the first pn-junction 21 is forward biased with a voltage which is higher than the forward voltage $U_F$ of the first pn-junction 21. Accordingly, electrons can flow from the channel region 1 into the floating semiconductor region 3 and are accumulated there, as indicated by the dashed arrows. Thereby, the p-type floating semiconductor region 3 is negatively charged.

When the source region 5, the drain region 7 and the contact region 3 are subsequently set to the same potential, for example by reducing the gate voltage $V_G$ to ground, both pn-junctions 21, 32 are, due to the negative charge of the floating semiconductor region 2, reverse biased. Accordingly, electrons are trapped in the floating semiconductor region 2 which thereby stays negatively charged. Furthermore, the negative excess charge of the floating semiconductor region 2 causes depletion of the channel region 1. The contact region 3 may partially be depleted, but to a much lesser extend due to the higher doping concentration in comparison to the channel region 1. Accordingly, a space charge region 14 is formed in the channel region 1 so that the low ohmic current path between the source region 5 and the drain region 7 is broken, and the JFET 100 is in the off-state which is illustrated in FIG. 1.

The amount of negative excess charge to be stored in the floating semiconductor region 3 to ensure normally-off operation of the JFET 100 may be expressed in terms of the depletion capacitance $C_1$ of the first pn-junction 21. The depletion capacitance of a pn-junction mainly depends on the area of the pn-junction, the voltage drop between the two semiconductor regions forming the pn-junction, and the doping concentrations and doping profile of the two semiconductor regions, respectively. The term "depletion capacitance" as used in this specification intends to describe the depletion capacitance of a pn-junction adjoining a channel region at minimum voltage drop to ensure pinching-off the conductive path through the channel region. Likewise, the term "specific depletion capacitance" as used in this specification intends to describe the depletion capacitance per area, in particular the mean depletion capacitance per area, of a pn-junction adjoining a channel region at minimum voltage drop to ensure pinching-off the conductive path through the channel region.

To switch the JFET 100 illustrated in FIG. 1 back to the conducting on-state, a high enough positive voltage drop between the contact region 3 and the channel region 1 has to be applied again. For example, a gate voltage $V_G$ which is about 10 V or 20 V higher than the voltage $V_D$ applied to the drain region 7 may be applied to the contact region 3. Accordingly, positive counter charges are formed in the contact region 3 which at least partly compensate the trapped electrons in the floating semiconductor region 2. Consequently, positive counter charges provided in the space charge region 14 of the channel region 1 are no longer required or at least to a much lesser extent. This in turn results in shrinkage of the space charge region 14 and flooding of the channel region 1 again with electrons, respectively, so that a conductive channel is again formed between the source region 5 and the drain region 7. The JFET 100 is now in the on-state. The on-state may correspond to the illustration of FIG. 2, but with electrons flowing from the source region 5 to the drain region 7. Any loss of excess electrons of the floating semiconductor region 2 during the off-state of JFET 100 even when no voltages are applied to the JFET 100, for example due to cosmic radiation and/or small leakage current across the pn-junction 21, 32, may be compensated in the on-state by electrons flowing across the forward biased first pn-junction 21.

The JFET 100 may also be described as a normally-off JFET which is configured to store an excess of minority charge carriers (electrons) of the gate region 2 in the gate region 2 so that the channel region 1 is depleted in an off-state of the normally-off JFET. When the JFET 100 is formed as a wide band-gap JFET, for example a SiC-JFET, the excess charges (electrons for n-channel JFETs) may be stored over many years without substantial loss. Accordingly, these devices may be delivered as normally-off semiconductor devices.

Depending on the application, the JFET 100 may also be formed as Si-JFET. Such a Si-JFET may, for example, be used as normally-off switch in logic circuits that may be cooled, for example to about 100 K, to reduce the leakage current. In addition, down cooling to about 100 K results in a reduction of the channel resistance of a Si-JFET by about one order of magnitude.

According to an embodiment, the resistance of the channel region 1 is controlled via the two antiserially connected diodes which are formed between the contact region 3 and the floating semiconductor region 2 ($n^+p^+$-diode), and between the floating semiconductor region 2 and the channel region 1 ($p^+n$-diode). The resulting parasitic $n^+p^\circ n$ bipolar transistor has typically a highly doped base formed by the floating semiconductor region 2 and is thus uncritical for the device operation.

A similar device but with opposite doping relations as illustrated in FIGS. 1 and 2 may also be provided. In these embodiments, positive excess charges (holes) are trapped in an $n^+$-type floating semiconductor region 2. Charging of the n-type floating semiconductor region 2 and opening of a conductive current path through the adjoining p-type channel region 1 are achieved by applying a negative voltage between the n-type floating semiconductor region 2 and the p-type channel region 1.

According to an embodiment, a depletion capacitance $C_2$ of the second pn-junction 32 formed between the floating semiconductor region 2 and the contact region 3 is larger than the depletion capacitance $C_1$ of the first pn-junction 21. The JFET 100 may, therefore, also be described as a normally-off JFET having a gate electrode structure 2, 3 with an integrated capacitive element of a capacitance $C_2$ which is higher than a depletion capacitance $C_1$ of a pn-junction 21 formed between the gate electrode structure 2, 3 and the channel region 1.

In the exemplary embodiments illustrated in FIGS. 1 and 2, an area of the first pn-junction 21 is slightly larger than an area of the second pn-junction 32. Typically, the specific depletion capacitance of the second pn-junction 32 is higher than the specific depletion capacitance of the first pn-junction 21 so that the depletion capacitance $C_2$ of the second pn-junction 32 is larger than the depletion capacitance $C_1$ of the first pn-junction 21.

The depletion capacitance $C_2$ of the second pn-junction 32 is typically higher than the depletion capacitance $C_1$ by a factor of ten or more. Typically, the specific depletion capacitance of the second pn-junction 32 is higher than the specific depletion capacitance of the first pn-junction 21 by a factor of ten or more. This may be achieved by appropriate doping relations and ensures that enough counter charges may easily be provided in the contact region 3.

Furthermore, in a blocking mode of the JFET 100 with a non-conducting channel region 1 (off-state) and an applied voltage drop between the drain region 7 and the source region 5 ($V_D$-$V_S$>0), a part of the trapped electrons in the floating semiconductor region 2 may, depending on geometry and applied voltages, have to compensate positive counter charges in the drain region 7. Due to the higher capacitance $C_2$ of the second pn-junction 32 compared to the capacitance $C_1$ of the first pn-junction 21, only a small increase of gate voltage $V_G$ is typically required to charge the floating semiconductor region 2 with the additional electrons to compensate counter charges of the drain region 7 in the blocking mode.

The JFET 100 may electronically be described as a normally-off JFET with two capacitive elements which have different capacitances $C_1$ and $C_2$ and are serially connected between the channel region 1 and a gate metallization and a gate terminal, respectively, to apply the gate voltage $V_G$. In the exemplary embodiment illustrated in FIGS. 1 and 2, the two capacitive elements are formed by the depletion layers of the first pn-junction 21 and the second pn-junction 32. Typically, the capacitance $C_2$ of the capacitive element which is directly connected with the gate terminal is larger than the capacitance $C_1$ formed by the pn-junction 21 between the floating semiconductor region 2 and the channel region 1. As will be explained with reference to FIG. 3, the capacitive element which is directly connected with the gate terminal may also be formed as a capacitor.

Figure 3:
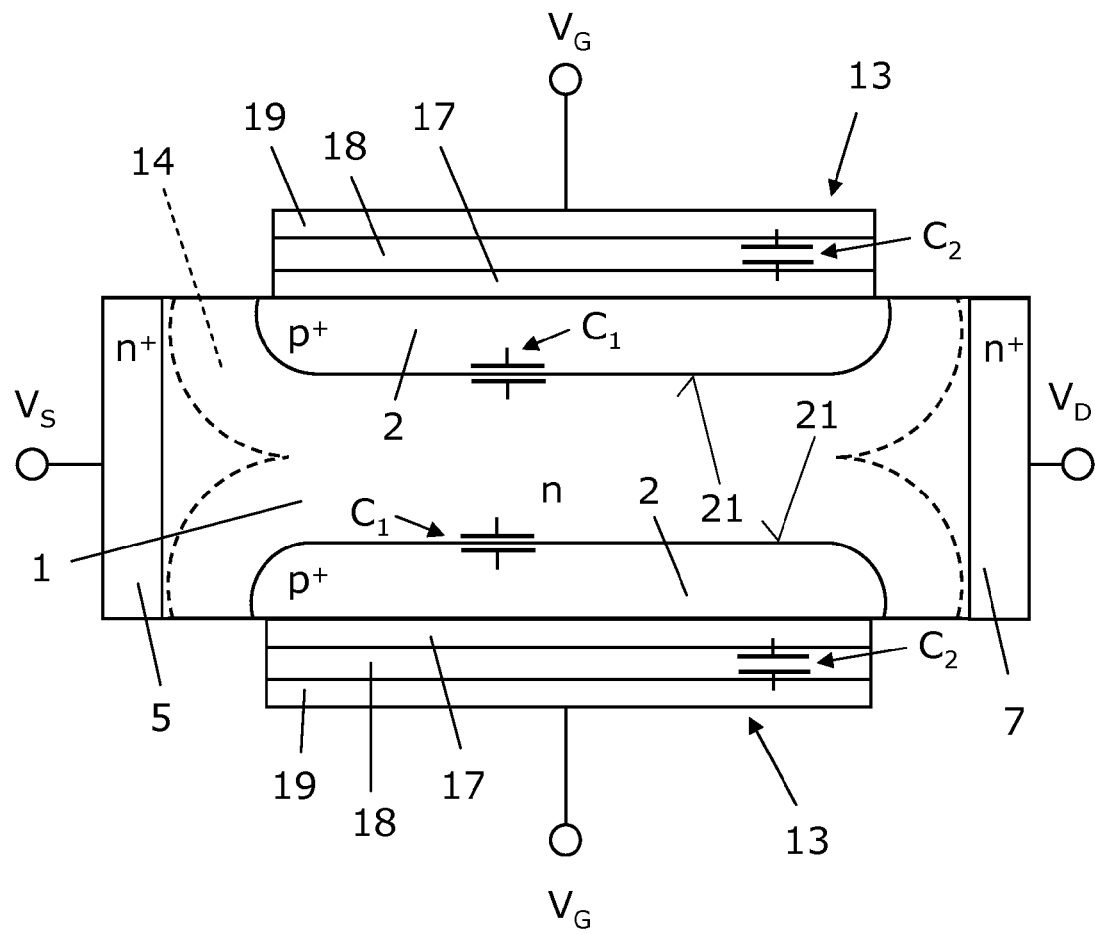
FIG. 3 schematically illustrates a normally-off semiconductor switch according to one or more embodiments.

FIG. 3 illustrates an embodiment of a JFET 200. The JFET 200 is similar to the JFET 100 illustrated in FIGS. 1 and 2. However, instead of a contact region which forms a pn-junction with a gate region, and which is in ohmic contact with a gate metallization, a capacitor 13 is connected between a gate electrode and the gate region of JFET 200.

The capacitor 13 typically includes a first electrode 17 in ohmic contact with the floating semiconductor region 2 typically forming a gate region, a second electrode 19 and a dielectric region 18 arranged between the first electrode 17 and the second electrode 19. The first electrode 17 typically forms a floating gate electrode. The second electrode 19 typically forms a gate electrode and may be in ohmic contact with a gate terminal.

Similar as explained with reference to FIG. 2, the floating semiconductor region 2 may be negatively charged by applying a positive voltage difference between the gate electrode 19 and the channel region 1, for example by applying 10 V or 20 V to the gate electrode 19 while the source region 5 and the drain region 7 are held at ground potential. This results in charging the first electrode 17 of the capacitor 13 with electrons through the forward biased pn-junction 21. Thereafter, the gate voltage $V_G$ is typically switched to ground so that excess electrons remain trapped in the first electrode 17 and the floating semiconductor region 2, respectively. This results in formation of a space charge region 14 so that a low ohmic current path between the source region 5 and the drain region 7 is broken. The semiconductor device 200 is now in the off-state.

Typically, the JFET 200 is a wide band-gap semiconductor device. Accordingly, excess charges are typically storable for at least many years in the floating semiconductor region 2 to an extend that ensures the off-state. The normally-off JFET 200 may, therefore, safely be delivered to customers in the off-state.

By again applying a positive voltage difference between the gate electrode 19 and the channel region 1, the semiconductor device 200 is switched to the conducting on-state, since excess electrons stored in the floating semiconductor region 2 are at least partly compensated and attracted, respectively, by positive counter charges on the gate electrode 19. Further, any loss of excess electrons in the floating semiconductor region 2 may be compensated in the on-state by electrons crossing the forward biased pn-junction 21.

According to an embodiment, a capacitance $C_2$ of the capacitor 13 is larger than the depletion capacitance $C_1$ of the first pn-junction 21, typically by a factor of ten or more.

According to an embodiment, the capacitor 13 includes an ONO-dielectric region 18 arranged between the first electrode 17 and the gate electrode 19. The ONO-dielectric region 18 includes a three layer $SiO_2$—$SiN$—$SiO_2$— stack. ONO-dielectric regions may be fabricated with high precision and sufficiently high effective dielectric constant.

The first electrode 17 and the second electrode 19 may be formed as respective metallizations. In these embodiments, the first electrode 17 and the second electrode 19 may also be referred to as floating gate metallization 17 and gate metallization 19, respectively. Typically, the first electrode 17 and the second electrode 19 are formed as highly doped polysilicon regions. The first electrode 17 may be arranged on and in ohmic contact with the floating semiconductor region 2, for example directly on the floating semiconductor region 2. Thereby, the capacitor 13 is monolithically integrated in the JFET 200. In this embodiment, the JFET 200 may also be described as a normally-off JFET having a gate electrode structure 2, 13 with an integrated capacitive element 13 of a capacitance $C_2$ which is higher than a depletion capacitance $C_1$ of a pn-junction 21 formed between the gate electrode structure 2, 31 and a channel region 1.

According to an embodiment, the capacitor 13 is formed without the first electrode 17 illustrated in FIG. 3. In this embodiment, the capacitor dielectric region 18, for example formed as ONO-dielectric region, forms a semiconductor-insulator interface with the floating semiconductor region 2. Accordingly, the floating semiconductor region 2 also forms a floating gate electrode of the capacitor 13.

Normally-off JFETs 100, 200 schematically illustrated in FIGS. 1 to 3 may be formed as planar semiconductor devices or as vertical semiconductor devices, in particular as vertical power semiconductor devices. Embodiments of vertical semiconductor devices are explained in the following.

Figure 4:
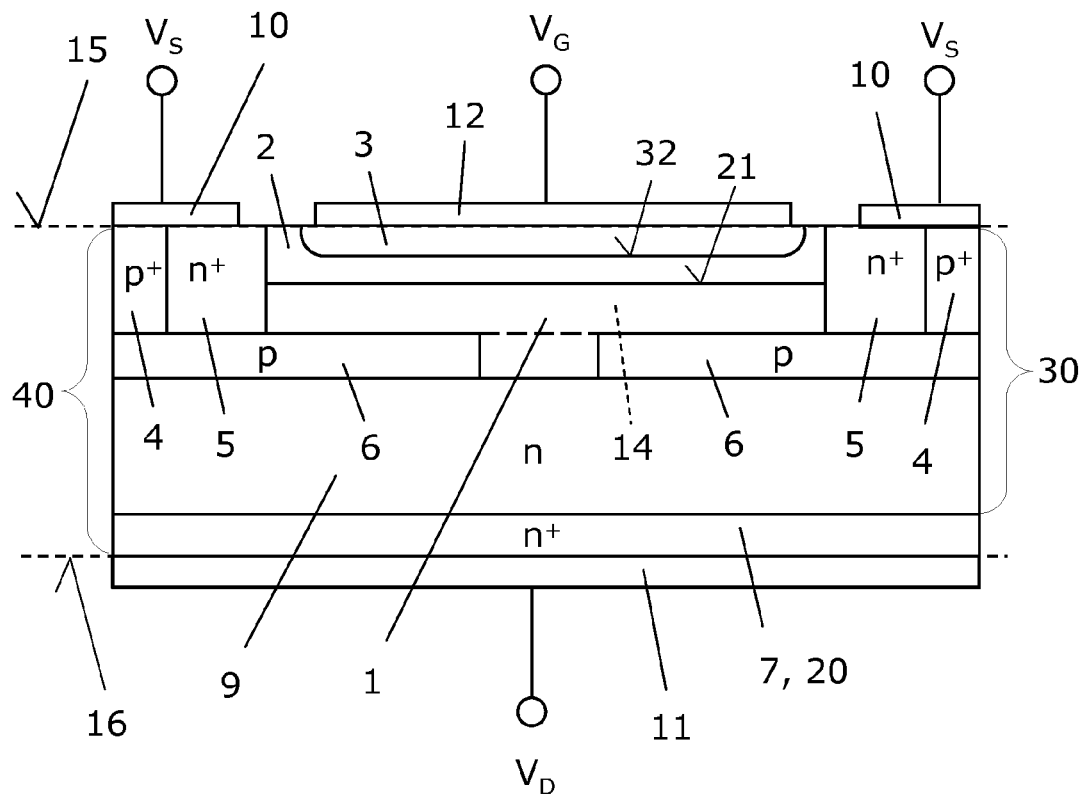
FIG. 4 schematically illustrates a normally-off semiconductor switch according to one or more embodiments.

FIG. 4 schematically illustrates an embodiment of a normally-off semiconductor switch 110 in a section of a vertical cross-section. The semiconductor switch 110 is similar to the semiconductor device 100 illustrated in FIGS. 1 and 2, and may also be operated as a normally-off JFET, typically as a normally-off power JFET. However, the semiconductor switch 110 includes a source metallization 10 and a gate metallization 12 which are arranged on a main horizontal surface 15 of a wafer or substrate forming a semiconductor body 40. The normal direction $e_n$ of the main horizontal surface 15 is substantially parallel to the vertical direction. Further, a drain metallization 11 is arranged opposite the gate metallization 12 on a back surface 16. Accordingly, the semiconductor switch 110 is a vertical semiconductor device.

Typically, the illustrated section of FIG. 4 corresponds to one of a plurality of unit cells of an active area of the semiconductor switch 110. Accordingly, the semiconductor switch 110 is typically a power semiconductor device.

The semiconductor body 40 can be a single bulk mono-crystalline material. It is also possible that the semiconductor body 40 includes a bulk mono-crystalline material 20 and at least one epitaxial layer 30 formed thereon. Using epitaxial layers 30 provides more freedom in tailoring the background doping of the material since the doping concentration can be adjusted during deposition of the epitaxial layer or layers.

According to an embodiment, the semiconductor body 40 includes an n-type channel region 1, an $n^+$-type contact region 3 in ohmic contact with the gate metallization 12, and a $p^+$-type floating semiconductor region 2 which is arranged between the contact region 3 and the channel region 1. The contact region 3 and the floating semiconductor region 2 may extend to the main horizontal surface 15. A first pn-junction 21 is formed between the channel region 1 and the floating semiconductor region 2. A second pn-junction 32 is formed between the contact region 3 and the floating semiconductor region 2.

In the exemplary embodiment illustrated in FIG. 4, the semiconductor body 40 further includes, in the illustrated vertical cross-section, two further p-type semiconductor regions 6 in ohmic contact, for example via respective $p^+$-type contact semiconductor regions 4, with the source metallization 10. The two further p-type semiconductor regions 6 are arranged mirror symmetrically, with respect to a central vertical mirror axis through the section illustrated in FIG. 4, next to and below the channel region 1. In an off-state of the semiconductor switch 110, at least an upper portion 14 of the channel region 1 between the two further p-type semiconductor regions 6 and the floating semiconductor region 2 is depleted and forms a space charge region 14. This is due to the stored excess electrons in the floating semiconductor region 2.

Charging of the floating semiconductor region 2 and switching of the semiconductor switch 110 into the on-state is done by applying a large enough voltage drop between the contact region 3 (source metallization 12) and the channel region 1 similar as described with reference to FIGS. 1 and 2. For example, a voltage difference of about 10 V to about 20 V may be applied between the gate metallization 12 and the source metallization 10 for these purposes. The source metallization 10 is in ohmic contact with the $n^+$-type source regions 5 which, in the illustrated vertical cross-section, adjoin the channel region 1 mirror-symmetrically with respect the central vertical mirror axis.

According to an embodiment, the semiconductor body 40 further includes an n-type drift region 9 which adjoins the channel region 1. The maximum doping concentrations of the drift region 9 and the channel region 1 may, depending on the application, be different or equal. The drift region 9 is arranged below the two further p-type semiconductor regions 6 and the channel region 1. Ohmic contact between the drift region 9 and the drain metallization 11 is typically provided by an $n^+$-type drain region 7.

In a blocking mode of the semiconductor switch 110, the two further p-type semiconductor regions 6 at least partly screen the floating semiconductor region 2 against positive charges of the drain metallization 11 and the drain region 7, respectively. Accordingly, less excess charges have to be stored in the floating semiconductor region 2 to compensate, in the blocking mode, charges of the drain metallization 11 and the drain region 7, respectively.

Similar as described with reference to FIGS. 1 and 2, the first pn-junction 21 of the semiconductor switch 110 has a depletion capacitance which is typically lower than a depletion capacitance of the second pn-junction 32. Accordingly, any non-screened positive charges of the drain metallization 11 and the drain region 7, respectively, may be easily compensated by storing more electrons in the floating semiconductor region 2 by applying only a slightly increased gate voltage $V_G$. Typically, a specific depletion capacitance of the second pn-junction 32 is larger than a specific depletion capacitance of the first pn-junction 21, for example by a factor of ten or more.

FIG. 4 represents only one typical cross-sectional view. Other cross-sectional views of the semiconductor device 110 may be similar, for example when the illustrated semiconductor regions are, in a direction which is perpendicular to the illustrated cross-section, substantially bar-shaped. It is, however, also possible that the channel region 1, the floating semiconductor region 2 and the contact region 3 are substantially disc-shaped, and that the $p^+$-type contact semiconductor regions 4, the source regions 5 and the further p-type semiconductor regions 6 correspond to respective single connected, for example ring-shaped semiconductor regions.

Figure 5:
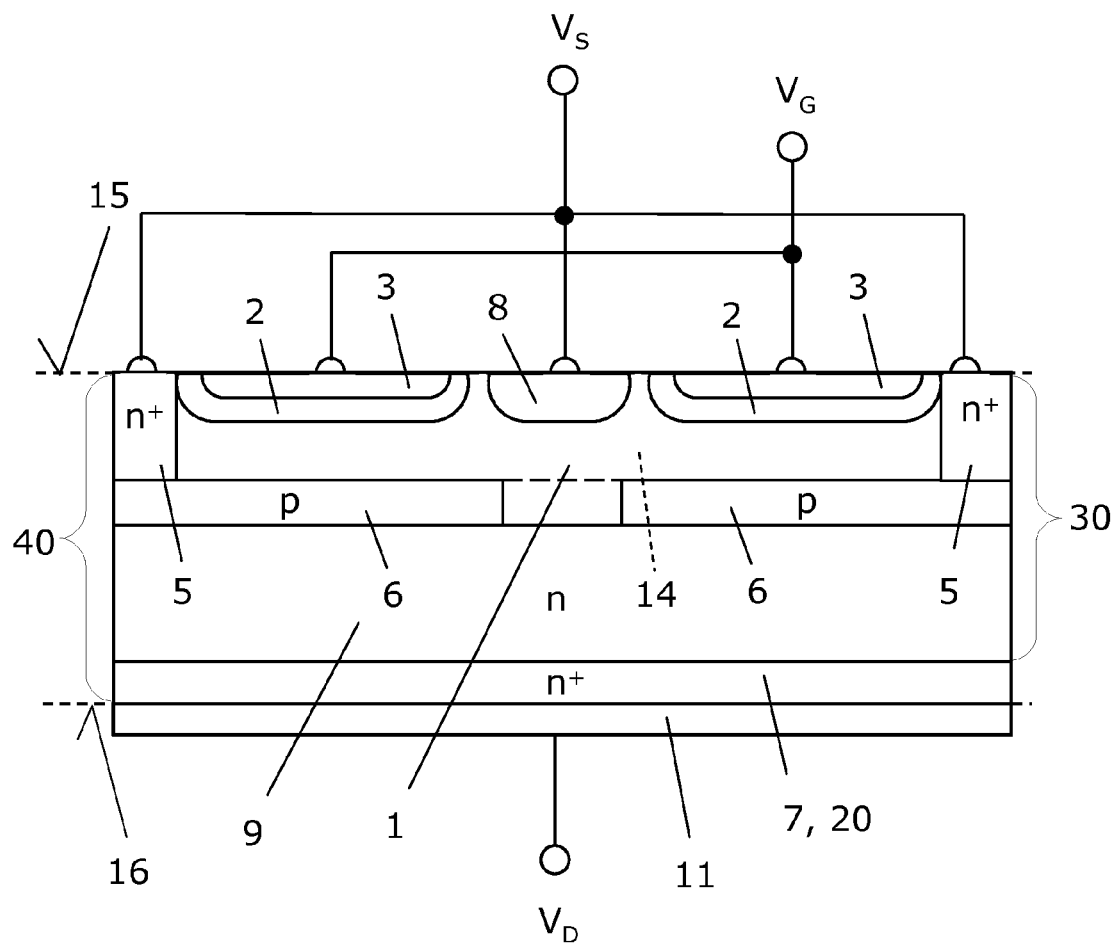
FIG. 5 schematically illustrates a normally-off semiconductor switch according to one or more embodiments.

FIG. 5 schematically illustrates an embodiment of a normally-off semiconductor switch 120 in a section of a vertical cross-section. The semiconductor switch 120 is similar to the semiconductor device 110 illustrated in FIG. 4 and may also be operated as a JFET. However, the semiconductor switch 120, includes, in the illustrated vertical cross-section, two mirror-symmetrically arranged $p^+$-type floating semiconductor regions 2 each of which includes a respective $n^+$-type contact region 3 in ohmic contact with the gate metallization. For sake of clarity, the gate metallization and the source metallization are not shown in FIG. 5, only the contacts to the source potential $V_S$ and the gate potential $V_G$, respectively, are illustrated as connecting lines. Further, $p^+$-type contact semiconductor regions, which are used to contact the source metallization and the two further p-type semiconductor regions 6, are not shown in FIG. 5. The $p^+$-type contact semiconductor regions may, for example, be formed in another vertical cross-section.

According to an embodiment, a p-type or $p^+$-type shielding region 8 is arranged between the two floating semiconductor regions 2. The shielding region 8 is in ohmic contact with the source metallization and screens or shields the floating semiconductor regions 2 against positive charges of the drain metallization 11 and the drain region 7, respectively, in the blocking mode of the semiconductor switch 120.

Similar as described with reference to FIG. 4, the two illustrated floating semiconductor regions 2 and the two illustrated contact regions 3 may correspond to a single connected, for example ring-shaped, floating semiconductor region 2 and a single connected contact region 3, respectively. In this embodiment, the p-type or $p^+$-type shielding region 8 may be substantially disc-shaped.

Figure 6:
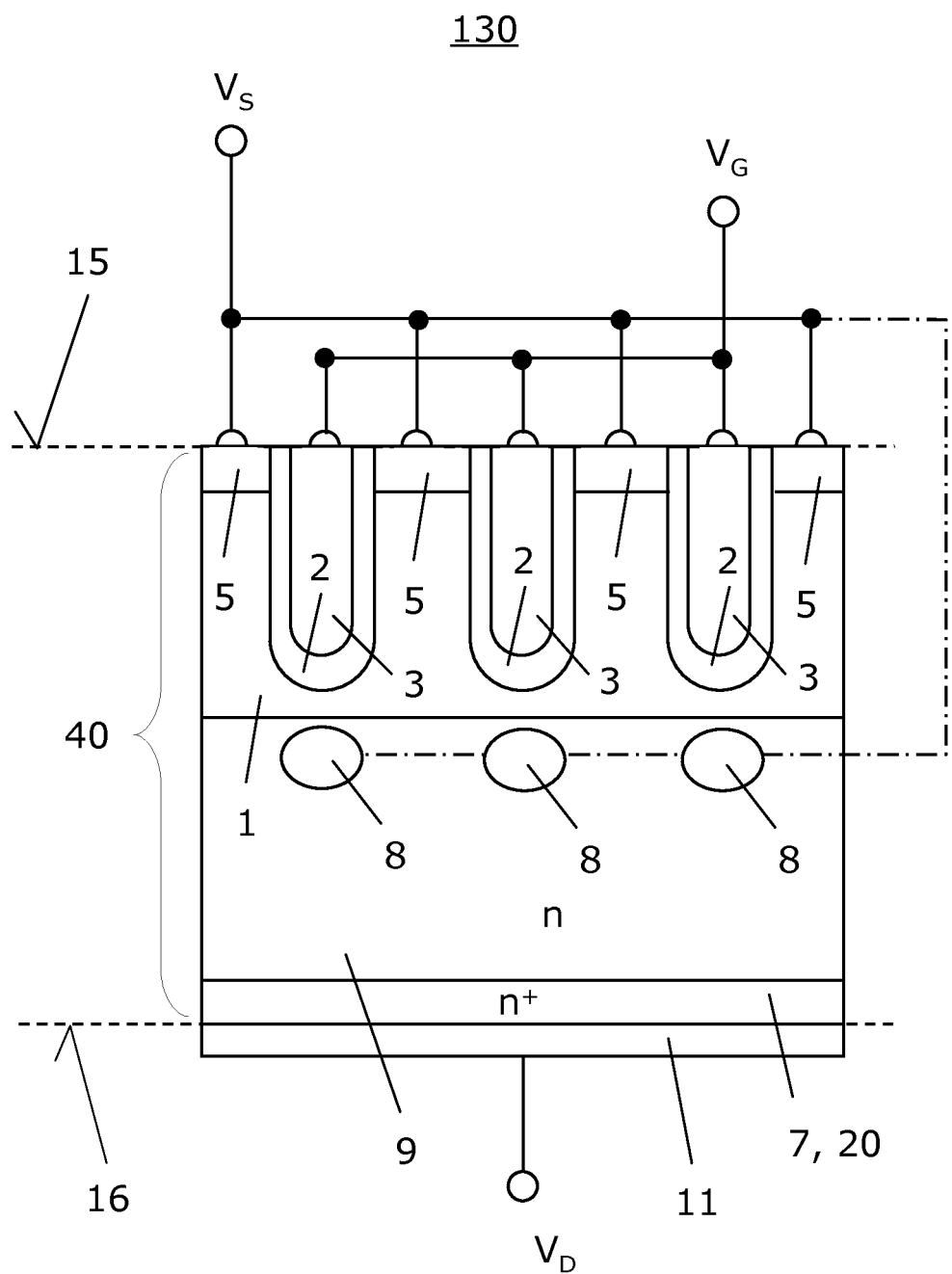
FIG. 6 schematically illustrates a normally-off semiconductor switch according to one or more embodiments.

FIG. 6 schematically illustrates an embodiment of a normally-off semiconductor switch 130 in a section of a vertical cross-section. The semiconductor switch 130 is similar to the semiconductor device 110 illustrated in FIG. 4 and may also be operated as a JFET. However, the semiconductor switch 130 includes, in the illustrated vertical cross-section, three $p^+$-type floating semiconductor regions 2 each of which includes a respective $n^+$-type contact region 3 in ohmic contact with the gate metallization. For sake of clarity, the gate metallization and the source metallization are not shown in FIG. 6, only the contacts to source potential $V_S$ and gate potential $V_G$, respectively, are illustrated as connecting lines. Furthermore, the channel region 1 is formed substantially between neighboring floating semiconductor regions 2. Due to the stored excess electrons in the floating semiconductor regions 2, at least portions of the channel region 1 between neighboring floating semiconductor regions 2 are depleted and form respective space charge regions so that the semiconductor switch 130 is a normally-off semiconductor device.

Instead of the three $p^+$-type floating semiconductor regions 2 illustrated in the vertical cross-section of FIG. 6, the semiconductor switch 130 may also include only two $p^+$-type floating semiconductor regions 2 or more than three $p^+$-type floating semiconductor regions 2.

Furthermore, the floating semiconductor regions 2, which are spaced apart from each other in FIG. 6, may be single connected. This also applies to the contact regions 3. In these embodiments, the source regions 5 illustrated in FIG. 6 typically correspond to separated source regions. It is however also possible that the source regions 5, which are spaced apart from each other in FIG. 6, are single connected and that the floating semiconductor regions 2 and the contact regions 3 are formed as respective separated semiconductor regions.

According to an embodiment, one or more p-type or $p^+$-type shielding regions 8 are arranged in the drift region 9 so that the one or more shielding regions 8 overlap, in a horizontal projection, with respective floating semiconductor regions 2. As indicated by the dashed-dotted line, the one or more shielding regions 8 are in ohmic contact with the source metallization. Accordingly, the floating semiconductor regions 2 are, in a blocking mode of the semiconductor switch 130, shielded against positive charges of the drain metallization 11 and the drain region 7, respectively.

Figure 7:
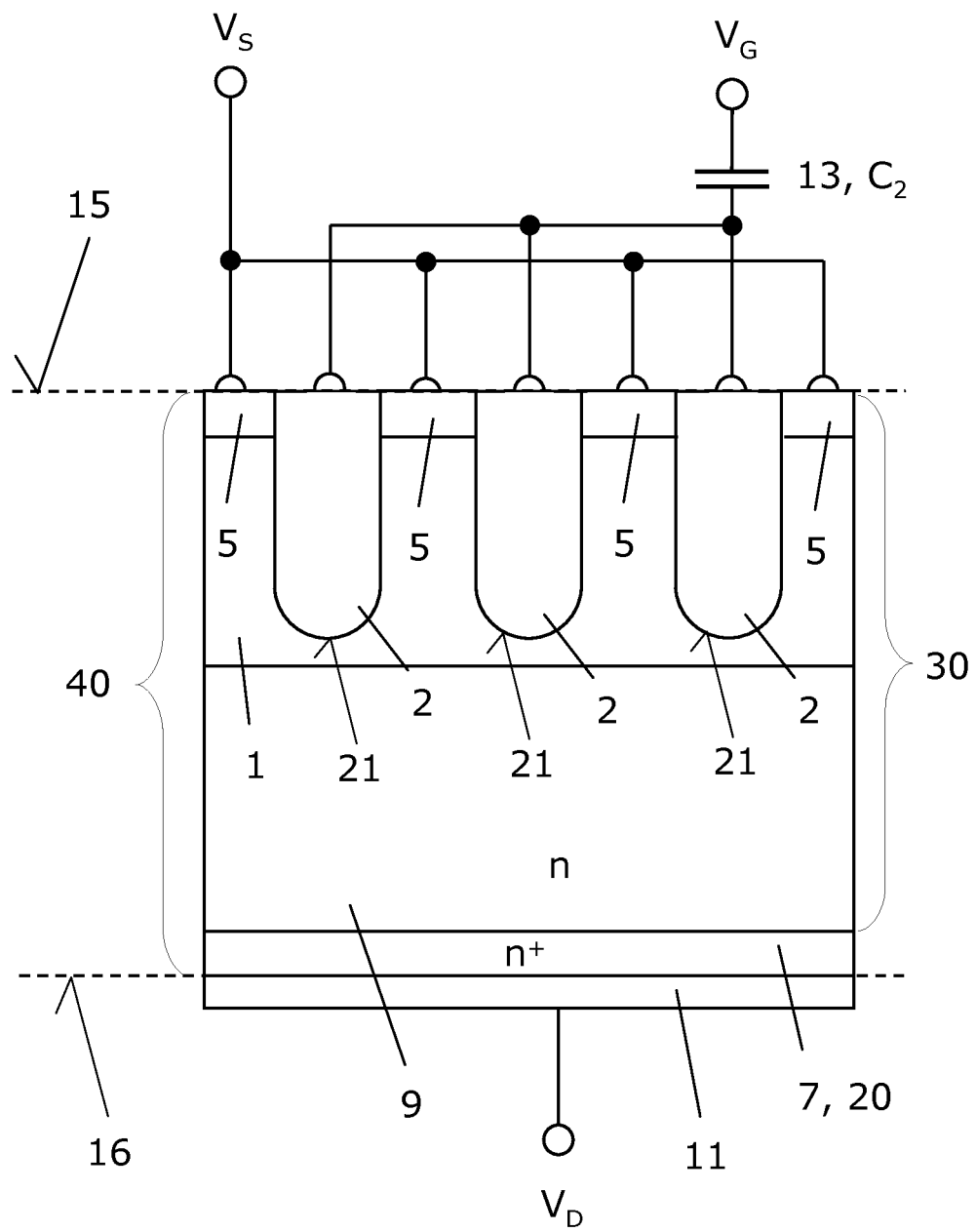
FIG. 7 schematically illustrates a normally-off semiconductor switch according to one or more embodiments.

FIG. 7 schematically illustrates an embodiment of a normally-off semiconductor switch 210 in a section of a vertical cross-section. The semiconductor device 210 is similar to the semiconductor device 200 illustrated in FIG. 3 and may also be operated as a normally-off JFET, typically as a normally-off power JFET. However, the semiconductor switch 210 includes a gate metallization forming a gate electrode and a source metallization which are typically arranged on a main horizontal surface 15 of a semiconductor body 40 as indicated by lines to source potential $V_S$ and gate potential $V_G$, respectively. For sake of clarity, the gate metallization and the source metallization are not shown in FIG. 7, only the contacts to the source potential $V_S$ and the gate potential $V_G$, respectively, are illustrated as connecting lines. A drain metallization 11 is arranged opposite the gate electrode on a back surface 16. Accordingly, the semiconductor switch 210 is a vertical semiconductor device.

According to an embodiment, the semiconductor body 40 includes, in the illustrated vertical cross-section, an $n^+$-type channel region 1, and two or more $p^+$-type gate regions 2 which extend from the main horizontal surface 15 into the semiconductor body 40. The gate regions 2 form respective pn-junctions 21 having a first depletion capacitance with the channel region 1. The gate regions 2 are connected with a capacitor 13 having a capacitance $C_2$ which is higher than the first depletion capacitance.

As described with reference to FIG. 3, excess electrons may be charged and stored by temporarily applying a positive voltage drop between the channel region 1 and the gate electrode. Accordingly, a space charge region is formed in the channel region 1 at least between neighboring gate regions so that the semiconductor switch 210 is normally in an off-state. By applying again a high enough positive voltage drop between the channel region 1 and the gate electrode, the semiconductor switch 210 is switched into the conducting on-state.

In the on-state, a current may flow from n⁺-type source region 5 typically forming a source electrode through the channel region 1, an n-type drain region 9 to an n⁺-type drain contact region 7 which adjoins the drain metallization 11 and typically forms a drain electrode.

According to an embodiment, the capacitor 13 is formed on the main horizontal surface 15. For example, a sandwich of a first highly doped poly-silicon-layer, a dielectric layer such as an ONO-layer and a second highly doped poly-silicon-layer is arranged on the main horizontal surface 15 so that the first highly doped poly-silicon-layer adjoins each of the gate regions 2 and forms a first electrode of the capacitor 13. The second highly doped poly-silicon-layer typically forms a second electrode of the capacitor 13 and a gate electrode of the semiconductor switch 210. The sandwich structure of the capacitor 13 typically includes vias for connecting the source regions 5 arranged on the channel region 1 and next to the gate regions 2 with the source metallization arranged above and insulated from the first electrode and the second electrode of the capacitor 13.

According to an embodiment, the capacitor 13 further includes one ore more p-type or p⁺-type shielding regions which are arranged in the drift region 9 so that the one or more shielding regions overlap, in a horizontal projection, with respective gate regions 2. As described with reference to FIG. 6, the one or more shielding regions provide a screen for the one or more gate regions 2 against positive charges of the drain region 7 and the drain metallization 11, respectively, in the blocking mode of the semiconductor switch 210.

Furthermore, the gate regions 2, which are spaced apart from each other in FIG. 7, may be single connected. In this embodiment, the source regions 5 illustrated in FIG. 7 typically correspond to separated source regions. It is however also possible that the source regions 5, which are spaced apart from each other in FIG. 7, are single connected and that the gate regions 2 are formed as separated floating semiconductor regions 2. A similar device as illustrated in FIGS. 1 to 6 but with opposite doping relations may also be provided.

The semiconductor devices described herein have in common that they include a channel region, a floating gate region which forms a first pn-junction with the channel region, a capacitive element and a gate metallization. The capacitive element connects the gate metallization with the floating gate region and has typically a capacitance which is larger than a first depletion capacitance of the first pn-junction. Accordingly, excess charges may be stored in the floating gate region so that the channel region is depleted such that the semiconductor device is in an off-state when no voltages are applied to the semiconductor device. The capacitive element is typically integrated and may be formed as capacitor, as explained with reference to FIGS. 3 and 7, or may be provided by a second pn-junction which is arranged between the gate region and the gate metallization, as explained with reference to FIGS. 1 and 2 and FIGS. 4 to 6.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A normally-off JFET, comprising:
    a channel region of a first conductivity type;
    a floating semiconductor region of a second conductivity type adjoining the channel region;
    a contact region of the first conductivity type adjoining the floating semiconductor region; and
    wherein the floating semiconductor region is arranged between the contact region and the channel region;
    wherein a first pn-junction having a first specific depletion capacitance is formed between the channel region and the floating semiconductor region; and
    wherein a second pn-junction having a second specific depletion capacitance larger than the first depletion capacitance is formed between the contact region and the floating semiconductor region.

2. The normally-off JFET of claim 1, further comprising a gate metallization in ohmic contact with the contact region.

3. The normally-off JFET of claim 1, wherein the second specific depletion capacitance is at least ten times higher than the first specific depletion capacitance.

4. The normally-off JFET of claim 1, wherein the channel region, the floating semiconductor region and the contact region comprise a wide band-gap semiconductor material.

5. The normally-off JFET of claim 1, wherein the normally-off JFET is a vertical power semiconductor device.

6. A normally-off semiconductor switch, comprising:
    a semiconductor body, comprising:
    a channel region of a first conductivity type;
    a floating semiconductor region of a second conductivity type forming a first pn-junction with the channel region; and
    a contact region of the first conductivity type forming a second pn-junction with the floating semiconductor region;
    a gate metallization in ohmic contact with the contact region; and
    wherein the floating semiconductor region is arranged between the contact region and the channel region;
    wherein the first pn-junction has a first specific depletion capacitance, and wherein the second pn-junction has a second specific depletion capacitance higher than the first specific depletion capacitance.

7. The normally-off semiconductor switch of claim 6, wherein the semiconductor body has a main horizontal surface to which the contact region extends and on which the gate metallization is arranged, the normally-off semiconductor switch further comprising a drift region of the first conductivity type adjoining the channel region and a drain electrode in ohmic contact with the drift region and arranged opposite the gate metallization.

8. The normally-off semiconductor switch of claim 7, further comprising a source electrode in ohmic contact with the channel region and arranged opposite the drain electrode.

9. The normally-off semiconductor switch of claim 8, further comprising a further semiconductor region of the second conductivity type in ohmic contact with the source electrode and arranged adjacent the channel region.

10. The normally-off semiconductor switch of claim 9, wherein the further semiconductor region of the second conductivity type is arranged such that the floating semiconductor region is at least partly shielded from the drain electrode.

11. The normally-off semiconductor switch of claim 6, wherein the normally-off semiconductor switch is a wide band-gap power semiconductor device.

12. A normally-off JFET, comprising:
a channel region of a first conductivity type;
a gate region of a second conductivity type adjoining the channel region;
a floating gate electrode in ohmic contact with the gate region;
a second gate electrode; and
a dielectric region between the second gate electrode and floating gate electrode and forming a capacitor with the floating gate electrode and the second gate electrode.

13. The normally-off JFET of claim 12, wherein a first pn-junction having a first depletion capacitance is formed between the channel region and the gate region, and wherein the capacitor has a capacitance higher than the first depletion capacitance.

14. The normally-off JFET of claim 12, further comprising a semiconductor body having a main horizontal surface to which the gate region extends, wherein the capacitor is arranged on the main horizontal surface.

15. A normally-off semiconductor switch, comprising:
a semiconductor body, comprising:
a channel region of a first conductivity type; and
a gate region of a second conductivity type forming a first pn-junction having a first depletion capacitance with the channel region;
a gate metallization; and
a capacitor formed so as to be electrically between the gate metallization and the gate region, the capacitor having a capacitance higher than the first depletion capacitance.

16. The normally-off semiconductor switch of claim 15, wherein the normally-off semiconductor switch is a power semiconductor device.

17. The normally-off semiconductor switch of claim 15, wherein the semiconductor body has a main horizontal surface to which the gate region extends and on which the gate metallization is arranged, the normally-off semiconductor switch further comprising a drift region of the first conductivity type adjoining the channel region and a drain electrode in ohmic contact with the drift region and arranged opposite the gate metallization.

18. The normally-off semiconductor switch of claim 17, further comprising a source electrode in ohmic contact with the channel region and arranged opposite the drain electrode.

19. The normally-off semiconductor switch of claim 15, wherein the capacitor comprises a poly-silicon region arranged on the gate region.

20. The normally-off semiconductor switch of claim 15, wherein a dielectric of the capacitor is formed by an ONO-region.

21. A normally-off JFET, comprising:
a channel region of a first conductivity type;
a gate region of a second conductivity type forming a first pn-junction with the channel region, the first pn-junction having a first depletion capacitance;
a source electrode in ohmic contact with the channel region;
a drain electrode in ohmic contact with the channel region;
a gate metallization; and
a capacitive element connecting the gate metallization with the gate region, the capacitive element having a capacitance larger than the first depletion capacitance.

22. The normally-off JFET of claim 21, wherein the capacitance between the gate metallization and the gate region is at least ten times larger than the first depletion capacitance.

23. The normally-off JFET of claim 21, wherein the capacitive element is formed by a second pn-junction arranged between the gate region and the gate metallization.

24. The normally-off JFET of claim 1, wherein the normally-off JFET comprises a semiconductor body and wherein the floating semiconductor region adjoins, in the semiconductor body, only semiconductor regions of the first conductivity type.

25. The normally-off JFET of claim 2, wherein the gate metallization is not in ohmic contact with the floating semiconductor region.

* * * * *

UNITED STATES PATENT AND TRADEMARK OFFICE
CERTIFICATE OF CORRECTION

| | |
|---|---|
| PATENT NO. | : 9,343,588 B2 |
| APPLICATION NO. | : 13/031956 |
| DATED | : May 17, 2016 |
| INVENTOR(S) | : W. Werner |

It is certified that error appears in the above-identified patent and that said Letters Patent is hereby corrected as shown below:

In the claims,

Column 15, line 27 (claim 12, line 9) please change "floating" to --the floating--

Signed and Sealed this
Twenty-sixth Day of July, 2016

Michelle K. Lee
*Director of the United States Patent and Trademark Office*